US006592728B1

(12) United States Patent
Paranjpe et al.

(10) Patent No.: US 6,592,728 B1
(45) Date of Patent: Jul. 15, 2003

(54) DUAL COLLIMATED DEPOSITION APPARATUS AND METHOD OF USE

(75) Inventors: Ajit Paranjpe, Sunnyvale; Peter Schwartz, Fremont; Jacques Kools, Fremont; Kang Song, Fremont; Dorian Heimanson, Foster City; Mehrdad Moslehi, Los Altos, all of CA (US)

(73) Assignee: Veeco-CVC, Inc., Fremont, CA (US)

( * ) Notice: Subject to any disclaimer, the term of this patent is extended or adjusted under 35 U.S.C. 154(b) by 0 days.

(21) Appl. No.: 09/130,527

(22) Filed: Aug. 4, 1998

(51) Int. Cl.[7] ............................................. C23C 14/34
(52) U.S. Cl. ................................................. 204/298.11
(58) Field of Search ....................... 204/298.11, 298.08, 204/298.07, 298.19, 298.2, 298.16

(56) References Cited

U.S. PATENT DOCUMENTS

| | | | | |
|---|---|---|---|---|
| 5,330,628 A | * | 7/1994 | Demaray et al. | 204/298.2 |
| 5,340,459 A | * | 8/1994 | Takehara | 204/298.07 |
| 5,415,753 A | * | 5/1995 | Hurwitt et al. | 204/298.11 |
| 5,415,756 A | * | 5/1995 | Wolfe et al. | 204/298.07 |
| 5,525,199 A | * | 6/1996 | Scobey | 204/298.07 |
| 5,527,438 A | * | 6/1996 | Tepman | 204/298.11 |
| 5,643,428 A | * | 7/1997 | Krivokapic et al. | 204/298.11 |
| 5,667,650 A | * | 9/1997 | Face et al. | 204/298.07 |
| 5,702,573 A | * | 12/1997 | Biberger et al. | 204/298.2 |
| 5,741,404 A | * | 4/1998 | Cathey | 204/298.11 |
| 5,744,016 A | * | 4/1998 | Yamada et al. | 204/298.11 |
| 5,750,012 A | * | 5/1998 | Ireland et al. | 204/192.12 |
| 5,800,688 A | * | 9/1998 | Lantsman et al. | 204/298.11 |
| 5,837,057 A | * | 11/1998 | Koyama et al. | 204/298.11 |
| 5,872,693 A | * | 2/1999 | Yoda et al. | 360/126 |

FOREIGN PATENT DOCUMENTS

JP   5-311419 A   * 11/1993   ............ 204/298.11

* cited by examiner

Primary Examiner—Nam Nguyen
Assistant Examiner—Gregg Cantelmo
(74) Attorney, Agent, or Firm—Gray Cary Ware & Freidenrich

(57) ABSTRACT

A dual collimation deposition apparatus and method are disclosed in which the dual collimation apparatus includes at least a long-throw collimator in combination with one or more physical collimators. A new physical collimator and shield design are also disclosed for improved process uniformity and increased equipment productivity.

3 Claims, 16 Drawing Sheets

1) MR-material + resist pattern
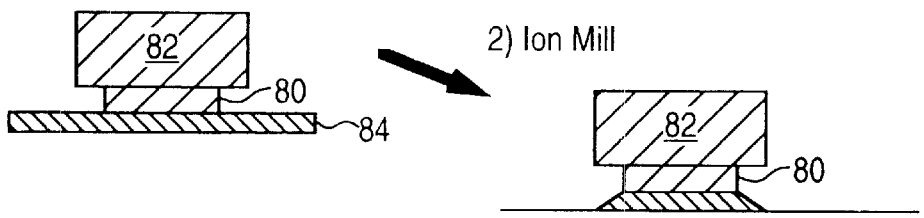
2) Ion Mill
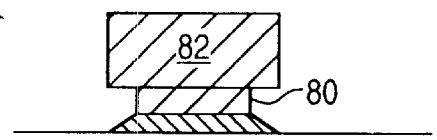
3) Cr underlayer deposition
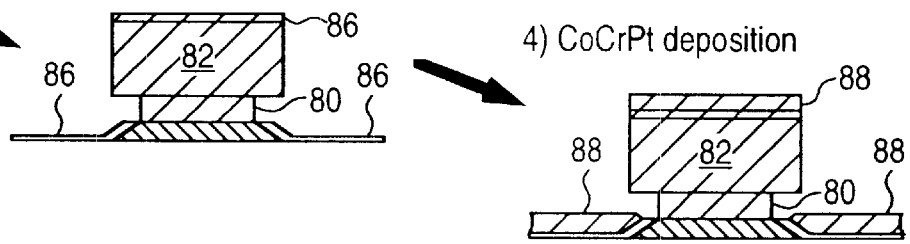
4) CoCrPt deposition
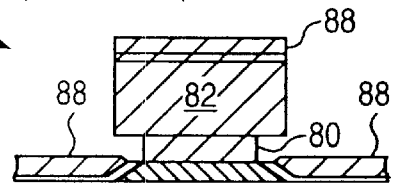
5) Lead deposition
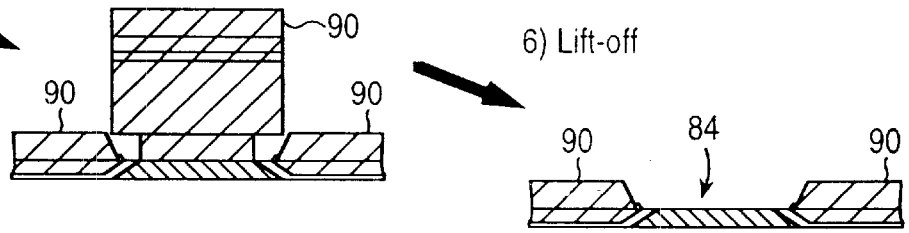
6) Lift-off
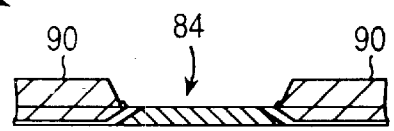
FIG. 2

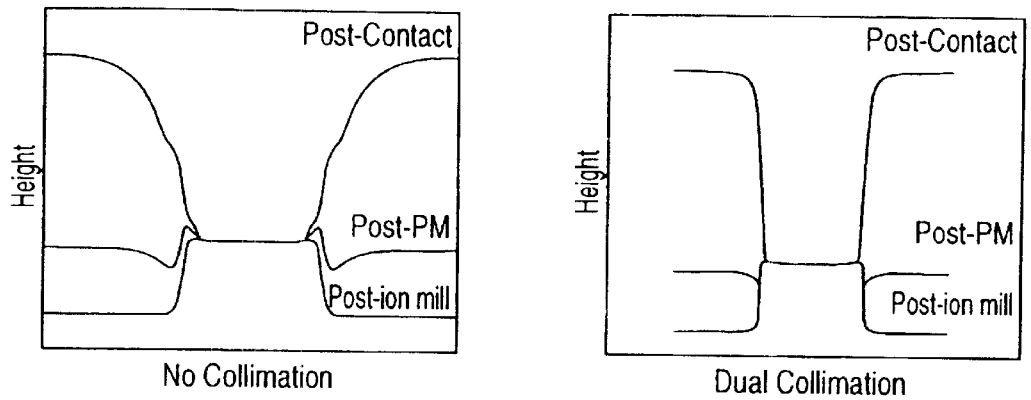
FIG. 7A
PRIOR ART
FIG. 7B
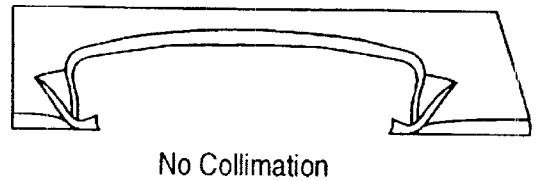
No Collimation
FIG. 8A
PRIOR ART
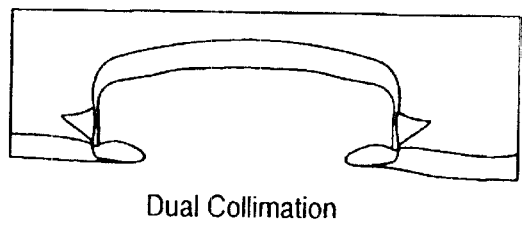
Dual Collimation
FIG. 8B

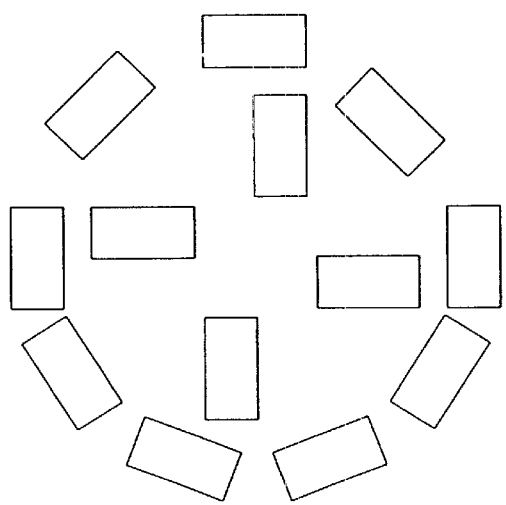 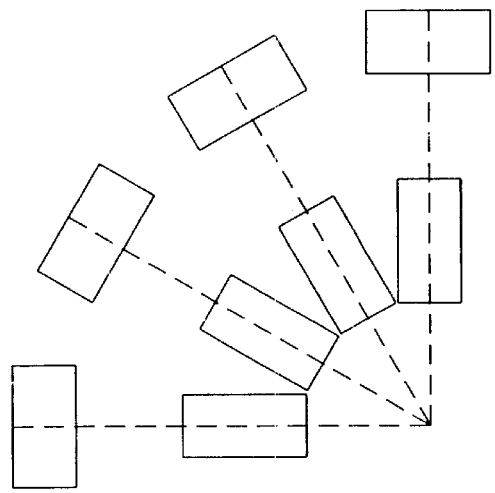
FIGURE 10A    FIGURE 10B
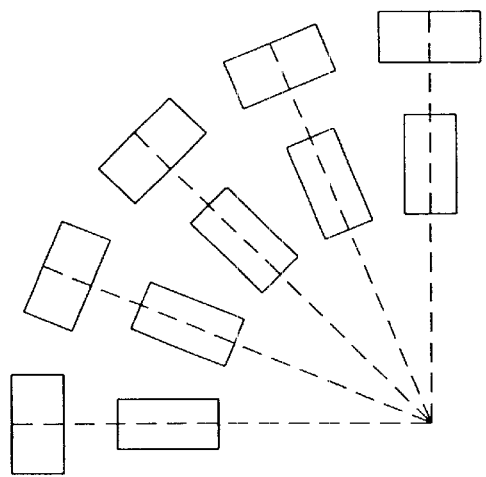 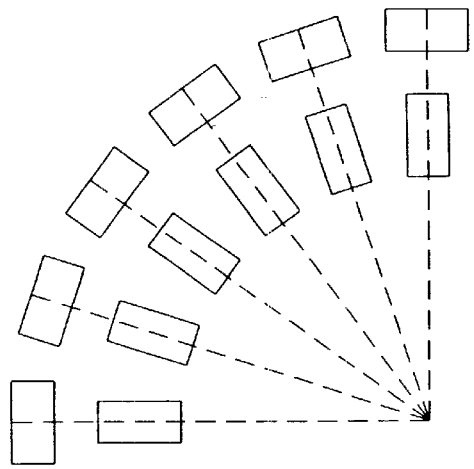
FIGURE 10C    FIGURE 10D SHEET RESISTANCE ( ♦ )
AND NON-UNIFORMITY ( ▲ )
OF Cr FILMS AS A
FUNCTION OF CHUCK HEIGHT SHEET RESISTANCE ( ♦ )
AND NON-UNIFORMITY ( ▲ )
OF Cr FILMS AS A
FUNCTION OF DEPOSITION PRESSURE

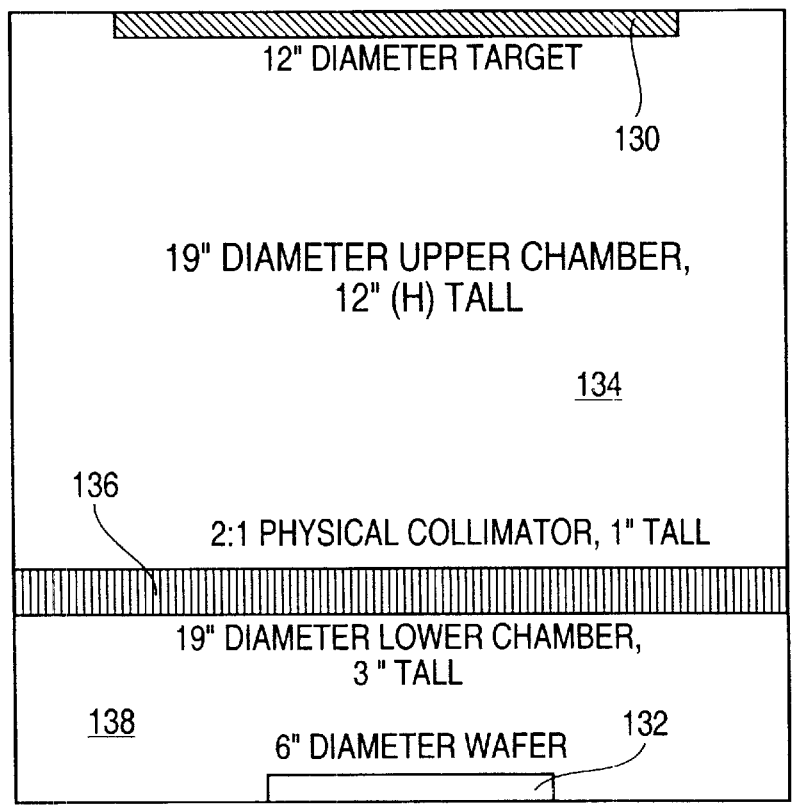
FIG. 18
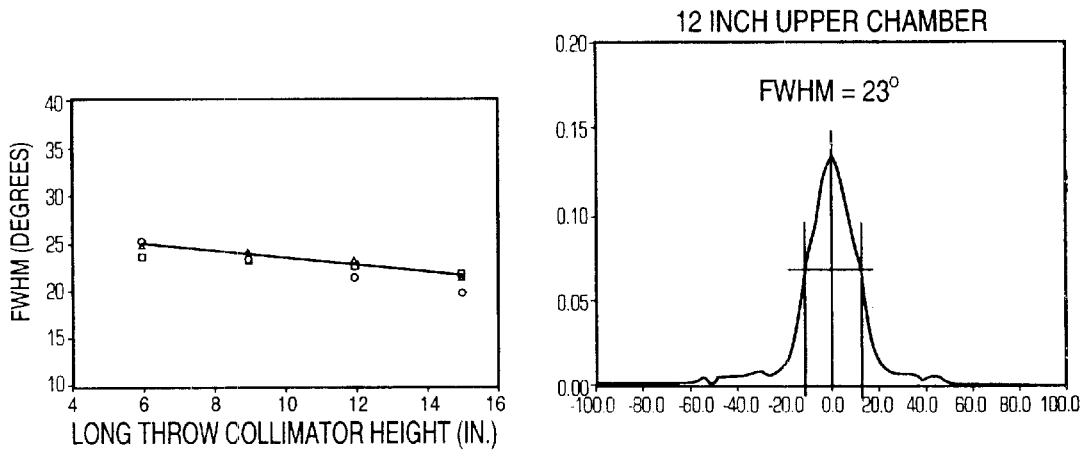
FIG. 19A
PRIOR ART
FIG. 19B
PRIOR ART

DUAL COLLIMATED DEPOSITION APPARATUS AND METHOD OF USE

BACKGROUND OF THE INVENTION

This invention relates generally to a system and method for depositing a thin film of material onto a surface of an object, such as a semiconductor or thin film head substrate, and in particular to a dual collimation system and method for depositing thin material films onto a semiconductor or a thin film head substrate.

Plasma sputtering is a physical vapor deposition (PVD) technique for thin film deposition. The process of sputtering a thin film onto an object is well known. The sputtering process may be used to deposit a thin film of material onto a plurality of different surfaces which may include a magnetic media substrate, magneto-optical media substrate, a semiconductor substrate, a thin-film head substrate, a flat-panel display substrate and the like. In the sputtering process, it is desired to place a thin film of atoms of a particular type, such as a cobalt, onto the substrate. A typical sputtering apparatus may include a piece of target material, a vacuum or low-pressure sputtering chamber, and a substrate located on a substrate holder beneath the target material. To cause some of the atoms or compound species from the piece of target material to deposit themselves on the substrate surface, an electrical DC, pulsed DC, AC or RF power supply is connected between the target material (typically via a bonded backing plate) and the chamber, and a low-pressure (e.g., 0.5 mTorr to 30 mTorr) inert gas (e.g., Ar) and/or a reactive gas (e.g., $N_2$, $O_2$ or the like) medium is established within the chamber. When a high enough voltage is applied to the target material, a plasma is formed with the atoms being released by the target material via ion bombardment by the plasma ions. The gas in the chamber may have a low pressure so that a majority of the atoms from the target material travel from the target material onto the substrate surface without colliding with any gas molecules (i.e., negligible or minimal scattering of the sputter species). In many thin-film deposition applications, to obtain the best quality thin films, it is desirable for the atoms to strike the surface of the substrate at a 90° angle (i.e., normal incidence) which provides a collimated stream of atoms.

In order to improve the quality of the thin film produced by the sputtering apparatus, the target may be located a greater distance from the substrate, which is known as a long-throw or natural sputtering apparatus. In the long-throw or natural sputtering apparatus, the atoms from the target material travel a longer distance so that the atoms that are not going to strike approximately perpendicular to the surface of the substrate, and within a space cone with relatively narrow angular distribution around the central normal axis, may strike the sides of the sputtering chamber. Thus, a larger percentage of the atoms or sputter species from the target material strike the surface of the substrate close to a perpendicular angle within a narrow angular distribution from the normal axis. The long-throw sputtering apparatus has several limitations. First, because the atoms or sputter species are traveling a greater distance to the surface of the substrate, they may strike more gas molecules due to scattering collisions and form poorer quality films unless the pressure of the gas in the sputtering chamber is reduced. If the gas pressure is reduced too much, however, there will not be sufficient gas pressure in the chamber to sustain a stable plasma. Typically, the long-throw sputtering processes require gas pressures preferably below 1 mTorr, thus limiting the process window for this technique. Moreover, the long-throw sputtering systems require more stringent vacuum pumping due to larger process chamber volumes and surface area.

Another technique to improve the quality of the thin films (i.e., improving the total number of atoms or sputter species which strike the surface of the substrate at a perpendicular angle or near perpendicular angles) is to place a perforated plate or a physical collimator in the chamber between the substrate and the target surface. This apparatus is called a physical collimation sputtering apparatus. The perforated plate has a predetermined aspect ratio (i.e., the ratio of the height of the hexagonal or circular holes in the plate to the diameter of the holes in the plate) so that most atoms which pass through the plate will strike the surface at approximately a right angle or within a narrow-angle cone around the perpendicular axis. Thus, the perforated plate acts as a spatial filter for the atoms or sputter species and prevents the atoms or sputter species emitted from the target material at more than some predetermined angle (outside a predetermined cone) from striking the surface of the substrate. The atoms or sputter species which strike the plate, but do not pass through the physical collimator holes, are deposited on the plate or within the holes. Therefore, as the plate is bombarded by more and more atoms, the holes of the plate will gradually become coated and eventually plugged up and the plate must be replaced after processing a certain number of substrates. Therefore, the total lifetime of the plate in the chamber is limited and the plate must be replaced often which is time consuming and reduces the overall equipment uptime. With either approach, the maximum collimation that can be achieved is limited.

Therefore, it is desirable to provide a sputtering apparatus which provides a more collimated stream of atoms or sputtering species which avoids these and other problems of known devices, and it is to this end that the present invention is directed.

SUMMARY OF THE INVENTION

In accordance with the invention, a dual collimated sputtering apparatus and method are provided which improves step coverage and bottom coverage in large aspect ratio contacts and vias in a semiconductor integrated circuit chip, improves bottom coverage and step coverage for barriers, liners in vias, or trenches in a semiconductor device, and reduces encroachment in a lift-off patterning structure for an abutted junction (the latter used in magnetic thin-film heads). The dual collimator in accordance with the invention may have a long-throw collimator combined with one or more physical collimators. The long-throw collimator provides some initial collimation and the subsequent one or more physical collimators provide additional filtering of the sputtered flux which enhances the overall degree of collimation. In addition, since the long-throw collimator already ensures that some non-collimated atoms or sputtered species strike the walls (of shield walls) of the deposition chamber, the perforated plates of the physical collimator block a smaller fraction of the incoming flux (i.e., atoms) so that the overall lifetime of the perforated physical collimator is increased. The dual collimator apparatus may also be operated at low pressures (e.g., such as less than 2 mTorr) so that the probability of atom scattering due to a collision with background gas atoms (within the long-throw collimator) is minimized so that more collimated atoms or sputtered species strike the surface of the substrate.

In addition, the bottom coverage for a 3:1 aspect ratio (AR) semiconductor via hole improves from about 30% using conventional physical collimation to as much as 50% using the dual collimation apparatus in accordance with the invention while the sidewall coverage of the via hole is not significantly affected (resulting in continuous coverage or topological features). As compared to a sputtering process with no collimation, dual collimation in accordance with the invention also reduces encroachment for lift-off structures by a factor or three. The sidewall angle of a metal layer deposited on a lift-off structure with respect to the horizontal plane increases from 10° for no collimation and 16° for long-throw collimation to 32° for dual collimation in accordance with the invention (the exact sidewall angle can be increased or decreased by changing the dual-collimation parameters).

In addition, the full width half maximum value (FWHM) of the sputtered flux incident on the wafer decreases from ±55° for no collimation and ±45° for long-throw collimation to ±25° for dual collimation indicating that more of the flux with the dual collimator strikes the wafer at close to a perpendicular angle. The dual collimation process in accordance with the invention also provides a well defined abutted junction in which the permanent magnet contacts of, for example, a magneto-resistive (MR) sensor may be placed with minimal overlap.

For a chromium (Cr) deposition, the deposition rate decreases from 100 Å/kW/min with a conventional long-throw collimator to only approximately 28 Å/kW/min with the dual collimator in accordance with the invention. This decrease in the rate of deposition may be attributed to the increased degree of collimation of the deposited atoms. In addition, a Cr (30 Å)/$Co_{82}Cr_6Pt_{12}$ (350 Å)/Cr (1150 Å) stack processed using the dual collimation process in accordance with the invention shows excellent magnetic properties with a coercivity of 1630 Oe and a squareness of 0.91.

To further improve the dual collimation process which increases the deposition uniformity and increases the mean number of wafers that may be processed between cleans (i.e., an indication of how quickly the perforated physical collimator plate becomes blocked), a novel perforated plate of a physical collimator and a new collimator shield are disclosed.

In accordance with the invention, a physical-vapor deposition apparatus for depositing material from a target onto a substrate is provided comprising a deposition chamber, a target holder housed within the chamber holding a target from which a deposition flux is generated, a sputtering energy source such as a DC magnetron source, a substrate holder housed within the chamber beneath the target holder, and a physical collimator between the target holder and the substrate holder for controlling an amount of deposition flux impinging on the substrate. The apparatus may further comprise a second collimator to provide, in combination with the physical collimator, a collimated deposition of material onto the substrate.

BRIEF DESCRIPTION OF THE DRAWINGS

FIG. 2 is a diagram showing the process steps to fabricate an abutted junction (such as for a magneto-resistive or MR thin-film head) which may be fabricated more precisely with a dual collimation device in accordance with the invention;

FIG. 7a is a diagram illustrating a simulation of an abutted junction fabricated using a conventional collimator;

FIG. 7b is a diagram illustrating the abutted junction of FIG. 7a fabricated using the dual collimator in accordance with the invention;

FIG. 8a is a diagram illustrating a lift-off structure fabricated using a conventional long-throw collimator;

FIG. 8b is a diagram illustrating the lift-off structure of FIG. 8a fabricated using the dual collimator in accordance with the invention;

FIGS. 10a–10d illustrate different rotating magnetron arrays that may be used in connection with the dual collimator;

FIG. 18 is an example of dual collimator system of the invention;

FIGS. 19A–19B are charts of FWHM value for a long-throw collimator;

DETAILED DESCRIPTION OF A PREFERRED EMBODIMENT

The invention is particularly applicable to a dual collimated DC magnetron sputtering deposition apparatus. It is in this context that the invention will be described. It will be appreciated, however, that the dual collimation apparatus and method in accordance with the invention has greater utility, such as being used with different deposition techniques such as RF diode sputtering, RF magnetron sputtering, ionized physical-vapor deposition (PVD), and ion beam deposition.

Figure 1A:
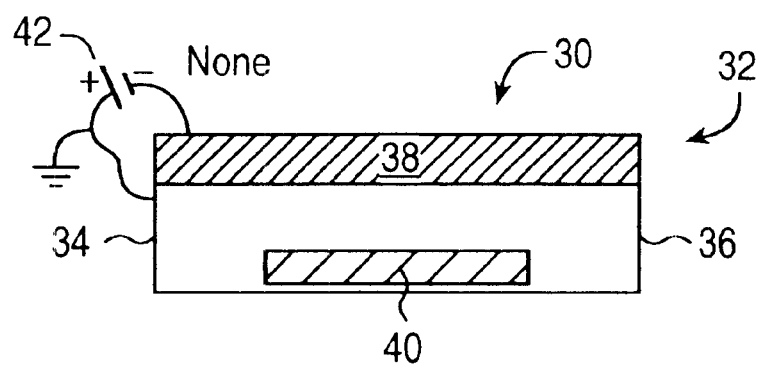
FIG. 1a is a diagram illustrating a conventional sputtering apparatus.

Prior to describing the dual collimator apparatus in accordance with the invention, several conventional prior art collimators will be described. FIG. 1a is a schematic diagram illustrating a conventional physical vapor deposition (PVD) apparatus 30 that includes a vacuum or low-pressure deposition chamber 32 having sidewalls 34, 36, a target assembly 38 and a substrate 40 placed within the chamber beneath the target assembly 38. A power supply 42 may apply a voltage, such as a negative DC voltage, to the target material. As the target material reaches a sufficiently high voltage, a plasma if produced due to the electrical breakdown of an inert gas and atoms on the surface of the target material are released. In fact, a plasma is formed because the pressure of the gas (which may be argon, helium, nitrogen, etc.) within the chamber 32 is adjusted to ensure that a plasma is produced and maintained. Once a plasma is established, the plasma ions bombard the target surface and the atoms or sputtered target species fall onto the substrate 40 at various incident angles. However, a good quality thin film is only formed when the atoms or sputtered species are normally incident (i.e., strike the substrate normal to the surface of the substrate because atoms or sputtered species that do not strike the surface at about 90° may results in voids and cause the film to delaminate or flake. An apparatus that attempts to ensure that more atoms strike the substrate normal to the surface are known as collimated deposition apparatus.

Figure 1B:
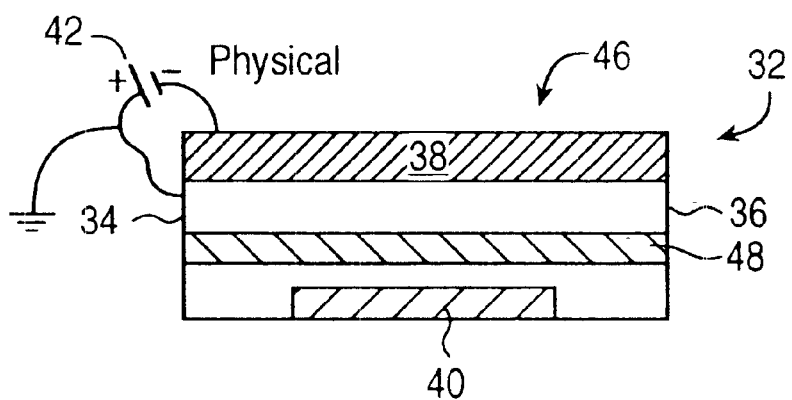
FIG. 1b is a diagram illustrating a sputtering apparatus equipped with a conventional physical collimator device.

FIG. 1b is a schematic diagram of a conventional physically collimated deposition apparatus 46 that includes the chamber 32, sidewalls 34, 36, the target assembly 38, the electrical power source 42, and the substrate 40 underneath the target assembly. The physically collimated deposition apparatus 46 may also include a perforated plate 48 placed between the target material and the substrate. The plate may have a plurality of hexagonal or circular holes through it in a predetermined pattern which block some of the atoms or sputtered species released by the target material. In particular, the holes in the plate have a particular height and diameter (and therefore a particular aspect ratio) so that atoms or sputter species approaching the substrate more than a predetermined number of degrees away from normal to the substrate (or outside a predetermined spatial cone) do not pass through the plate which improves the collimation of the atoms and improves the quality of the thin films being deposited. The physical collimated deposition apparatus, however, suffers from a short mean time between cleanings since the holes in the plate become rapidly blocked by the atoms that do not pass through the holes of the plate.

Figure 1C:
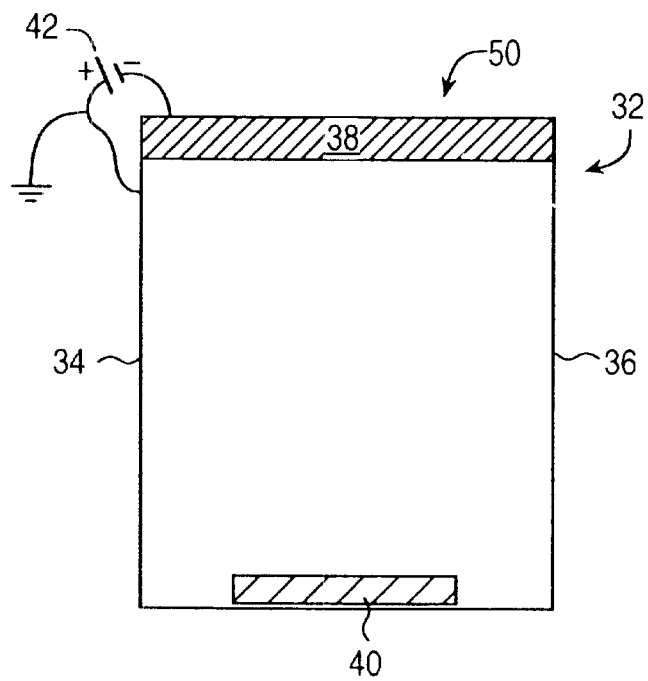
FIG. 1c is a diagram illustrating a sputtering apparatus equipped with a conventional long-throw collimator.

FIG. 1c is a diagram of a conventional long-throw, natural collimation deposition apparatus 50 which also improves the collimation of the atoms (i.e., more atoms strike at a normal angle to the surface of the substrate). The long-throw collimation apparatus also includes the chamber 32 with sidewalls 34, 36, a target assembly 38, an electrical power source 42 and a substrate 40 underneath the target assembly. To improve the collimation of the atoms or sputtered species being deposited, the distance between the target and the substrate is increased so that atoms which are not falling within the predetermined angular distribution cone with respect to the normal axis to the substrate surface are more likely to strike the sidewalls 34, 36 of the chamber (or the corresponding chamber shields, not shown) instead of the substrate. The long-throw collimator PVD apparatus, however, suffers from several drawbacks. First, because the target is farther from the substrate, the atoms must travel a greater distance and therefore may strike more gas molecules (more gas-phase scattering) which reduces the collimation of the atoms or sputtering species. It is possible to reduce the pressure of the gas in the chamber to reduce the number of gas molecules, but a stable plasma cannot be formed at too low of a pressure (e.g., at pressures much below 1 mTorr). Second, since atoms strike the sidewalls 34, 36, films form on the sidewalls which may chip off and contaminate the thin film on the substrate with particles. Now a dual collimation apparatus in accordance with the invention will be described.

Figure 1D:
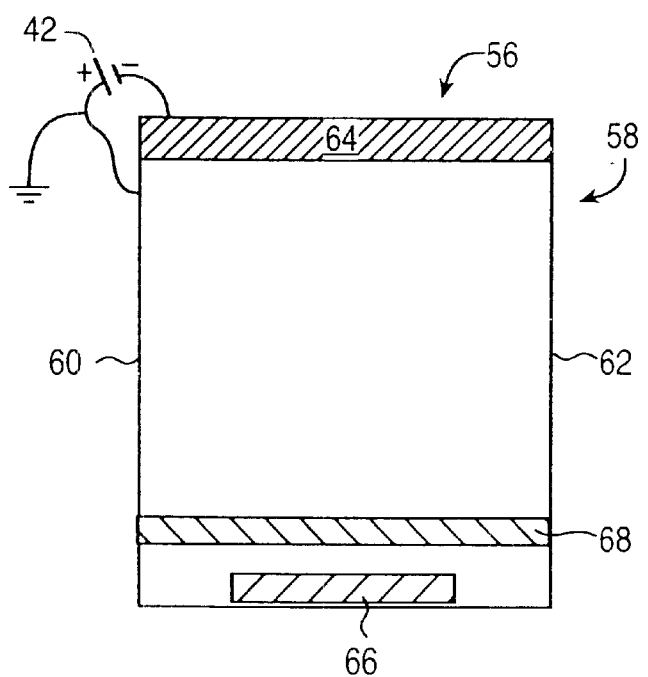
FIG. 1d is a diagram illustrating a sputtering apparatus equipped with a dual collimator device in accordance with the invention.

FIG. 1d is a dual collimated deposition apparatus 56 in accordance with the invention. The apparatus may have a vacuum or low-pressure chamber 58 with sidewalls 60, 62, a target assembly 64 and a substrate 66 located underneath the target assembly 64. In accordance with the invention, the deposition apparatus may include a long-throw deposition apparatus and one or more perforated physical collimators plates 68 located between the target assembly 64 and the substrate 66. The one or more plates may have a plurality of holes in a predetermined pattern which blocks some of the atoms or sputtered species generated by the target. In accordance with the invention, the combination of the long throw deposition apparatus with the one or more perforated plates further increases the collimation of the atoms, as described below. The dual collimated deposition apparatus also increases the lifetime of the perforated plate, as described below. The theoretical results obtained with the conventional deposition apparatus and the dual collimator in accordance with the invention will now be described.

Theoretical calculations show that both a 1:1 aspect ratio long-throw collimation PVD (the aspect ratio is the ratio of the height of the collimator to the diameter of the collimator) and a 1.5:1 aspect ratio (AR) physical collimation PVD into a via hole stricture are expected to provide similar results with a maximum incident angle (as measured from the wafer surface normal) of sputtered atoms of ~30° as described below. This result assumes that there is no scattering of the sputtered species or atoms by the background gas during their transit to the wafer which is a reasonable assumption for sputtering pressures below 2 mTorr in the case of physical collimation in which the mean free path for sputtered atoms is ~10 cm at 1 mTorr. For a 12" long-throw collimator having a 6" substrate, a 12" target and a 15–18" distance between the target and substrate, the maximum incident angle (MIA) is Arc Tan((½ substrate size+½ target size)/Target–Substrate distance)=Arc Tan(9"/(15–18")). For physical collimation, the maximum incident angle is Arc Tan(1/A.R.)=Arc Tan(1/1.5). Thus, both collimators have about a 30° maximum incident angle around the perpendicular axis.

No further improvement in collimation is expected by increasing the distance between the target and the substrate in the long-throw collimator since, as the distance is increased, there is a greater likelihood that the sputtered atoms will be scattered in their transit to the wafer by gas molecules. Slight improvement may be expected by decreasing the sputtering pressure to reduce the number of gas molecules, but even at 2 mTorr, the typical transit path is a factor of four longer than the mean free path for the sputtered atoms. Increasing the physical collimator aspect ratio (i.e., the ratio of the height of the holes to the diameter of the holes) to 2:1 will also provide some improvement and the maximum incident angle will decrease to about ~25°, resulting in a sharper angular distribution of the sputtered species.

In accordance with the invention, a maximum improvement resulting in a minimum MIA is expected by combining collimation approaches (i.e. dual collimation). For example, a long-throw collimator can be combined with one or more perforated plates of a physical collimator as shown in FIG. 1d. The dual collimation apparatus in accordance with the invention provide s the following advantages which will be described in more detail below. First, the dual collimator provides a sharper cutoff angle for the sputtered atoms even though the maximum incident angle is not affected. In particular, combining collimators reduces the full width half maximum value (FWHM) of the sputtered flux at the wafer, and significantly reduces the flux in the wings of the distribution (i.e. flux at high incident angles) as described below with reference to FIG. 3.

Second, since the sputtered atoms will lose some energy during the transit between the long-throw collimator and the perforated plate of the physical collimator, the sputtered atoms which strike the physical collimator are more likely to stick to the surfaces of the physical collimator rather than scatter off of the collimator holes. Any atoms that scatter off the collimator holes tend to reduce the degree of PVD collimation. In addition, a sputtering gas may be introduced between the long-throw collimator (using a gas injection port on the long-throw collimator or a gas injection ring around the target) and the physical collimator so that a pressure differential can be established across the physical collimator. In this mode, a low pressure can be achieved between the physical collimator and the substrate, while a slightly higher pressure exists in the vicinity of the target. This higher pressure is necessary to sustain a stable plasma while the lower pressure means that the sputtered atoms may collide with fewer gas molecules so that the PVD collimation is increased. A secondary electron source (e.g. hollow cathode source) and/or another pumping port in the vicinity of the target may also be added to the dual collimator to further reduce the minimum sputtering pressure which reduces the likelihood a sputtered atom may strike a gas molecule. Finally, atoms that experience large angle collisions in the long-throw collimator are filtered out or stopped by the physical collimator so collimation is further increased.

FIG. 2 illustrates an example of a series of process steps that benefit from the use of a dual collimator in accordance with the invention. In particular, an abutted junction for a magneto-resistive (MR) head may be formed by a lift-off process in which highly collimated sputtered atoms are desirable because the lift-off process will not be clean if a fairly sharp sidewall cannot be formed. In particular, for the abutted junction, it is desirable to minimize sidewall coverage—particularly under an overhang structure. Any deposition of metal on sidewalls of the structure is detrimental to pattern fidelity and may result in flaps which can break free from the structure and contribute to surface particle contamination.

For higher recording densities, track widths become narrower and abutted junctions formed using dual collimation allow for narrower track widths. Another application for dual collimation is improved step coverage for liner/barrier deposition in high-aspect-ratio vias/trenches encountered in ULSI devices, such as semiconductor interconnect structures. Traditionally, either physical or long-throw collimation have been used but these techniques are ineffective for aspect ratios exceeding 4:1.

In the magneto-resistive (MR) head process, a release layer 80, an MR material 84, and a resist material 82 are formed on a ceramic substrate. The MR layer is then patterned by the ion milling as shown in FIG. 2. Next, a chromium underlayer 86 and a cobalt-chromium-platinum (CoCrPt) layer 88 are deposited along the entire substrate using a collimated deposition method. Next, a lead metal layer 90 is deposited along the entire substrate preferably using a dual collimator in accordance with the invention so that the sidewall deposition of the lead metal is minimized and the central portion may be lifted off without having pieces of the sputtered material break off because they are attached to the central portion. Three deposition steps in this process sequence can be performed using the dual collimation technique of this invention. An example of a dual collimator in accordance with the invention will now be described.

Figure 3:
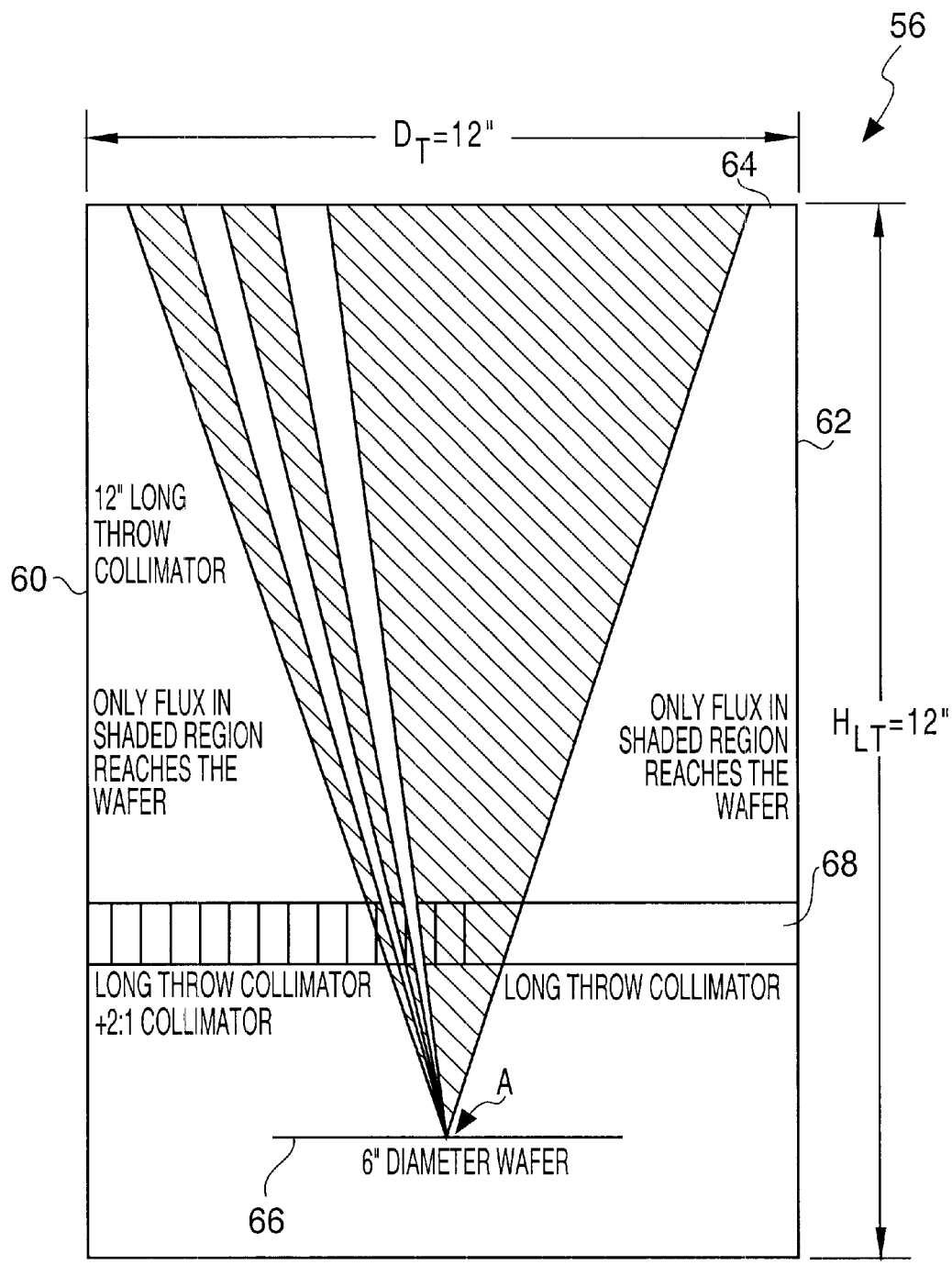
FIG. 3 is a diagram illustrating more details of the dual collimator device of FIG. 1d.

FIG. 3 is a diagram of an example of the dual collimator 56 in accordance with the invention. In this example, the collimator may have a target 64 that is 12" in diameter, a wafer 66 which is 6" in diameter, and a 12" distance between the target 64 and a physical collimator 68. The physical collimator 68 may have a 2:1 aspect ratio in this example (i.e., the ratio of the height of the holes in the plate to their diameter). As shown, due to the combination of the long-throw collimator and the physical collimator, only the sputtered atoms traveling in the shaded region may reach point A on the wafer. Therefore, the maximum incident angle is closer to 0° so that more of the sputtered atoms strike the wafer perpendicular to the surface of the wafer (i.e. more collimated atoms). Now, various experimental results with the dual collimator in accordance with the invention will be described.

First, the experimental results for the DC magnetron deposition of Cr and CoCrPt layers for an MR head as shown in FIG. 2 using a dual collimator is described. The Cr and CoCrPt collimation experiments were performed on a CVC Connexion-600 platform using one process module configured for DC magnetron sputter deposition. An apple-shaped magnetron array for the Cr depositions was equipped with samarium cobalt (SmCo) magnets while the array used for CoCrPt was equipped with higher strength neodymium iron boron (NdFeB) magnets. The module was configured with two collimation sources placed in series: (1) a long-throw collimator providing an aspect ratio of 1:1 and (2) a honeycomb pattern physical collimator with an aspect ratio of 2:1. The process gas was injected into the chamber through a port in the long-throw collimator collar midway between the target and the physical collimator. This injection position provides unrestricted gas flow to the plasma while possibly allowing a reduced pressure below the physical collimator.

Preliminary experiments were performed to determine the minimum pressure necessary to generate and sustain a stable plasma. The minimization of the process pressure necessary for a plasma allows for an increased mean free path of the sputtered material (i.e., the sputtered atoms or species may strike fewer gas atoms during deposition) which is required to maintain a high degree of collimation. For Cr deposition, the stable process pressure was determined to be 0.8 mTorr and was limited by the stability of the throttle valve controller. For CoCrPt, the process pressure was maintained at 1.5 mTorr to ensure process stability. In both cases, the plasma was ignited at 30 mTorr with a gas burst and then the pressure was reduced for the pre-deposition target clean. Following the target pre-clean, the shutter was opened with the plasma ignited and the deposition timer started. The deposition rate and stress measurements were performed on 4" oxide-coated silicon (Si) wafers. The demonstration depositions were performed on aluminum titanium carbon (AlTiC) pucks with photo-resist patterns and on 6" blanket/patterned oxide-coated Si wafers.

The process recipes used for the collimation experiments and the corresponding deposition rates and stress values are summarized in Table 1. All samples received a pre-deposition sputter etch (clean) of the surface at 400 W in a 6 mTorr argon (Ar) ambient.

TABLE 1

Summary of process parameters for Cr and CoCrPt depositions.

| Parameter | Cr | CoCrPt |
|---|---|---|
| Power (W) | 4000 | 4000 |
| Pressure (mTorr) | 0.8 | 1.5 |
| Bias (W)/(V) | 9/80 | 0/1 |
| Chk. Ht. (in) | 1.3 | 1.3 |
| Flow (sccm) | 10 | 15 |
| Rate (Å/s) | 1.8 | 2.9 |
| Stress (dynes/cm$^2$) | $4.6 \times 10^8$ tensile | $8.0 \times 10^9$ tensile |

A three layer stack structure consisting of a 30 Å thick Cr layer, a 350 Å thick $Co_{82}Cr_6Pt_{12}$ layer and a 1150 Å thick Cr layer was deposited. Because only one set of collimators was available, the three layers were deposited on three sequential days. On day 1, a 50 Å layer of Cr was deposited and the samples were stored in the load-lock overnight while the chamber was prepared for the CoCrPt depositions. On day 2, 20 Å of Cr was etched from the substrate surface and a 370 Å layer of CoCrPt was deposited on top of the Cr and stored in the load-lock overnight. On day 3, 20 Å of CoCrPt was removed and 1150 Å of Cr deposited. The etch rates were determined by measuring the sheet resistance of a film of known thickness before etching under the conditions described above. After the etch experiment, the sheet resistance was re-measured to determine the amount of material removed. To remove 20 Å of Cr, the etch was performed for 48 seconds while only 30 seconds were required to remove 20 Å of CoCrPt.

For uniformity improvement experiments, depositions of both Cr and molybdenum (Mo) were performed using the dual collimation configuration. For the DC magnetron sputtering apparatus in the experiments, SmCo magnets were used to fabricate a variety of magnetron arrays, while a NdFeB magnet array was used during the optimization of the design of the physical collimator. The module was configured with two collimation sources placed in series as shown in FIG. 3, with a long-throw collar providing an aspect ratio of 1:1 and a honeycomb pattern physical collimator with an aspect ratio of 1.5:1. The process gas was injected into the chamber through a port in the long-throw collimator collar midway between the target and the physical collimator. This injection port provides unrestricted gas flow to the plasma while possibly allowing a reduced pressure below the physical collimator.

For evaluating various magnetron designs, the distance from the target to the physical collimator was set to 12.25" and the distance from the physical collimator to the chuck was set at 3.5". While optimizing the physical collimator these distances were changed to 10.5" and 5.25" by adding a 1.75" chamber spacer under the physical collimator. The thickness of the physical collimator is 7/8". All film depositions were performed on 6" oxide coated Si wafers. The sheet resistance and uniformity (measured at diameters of 6", 5", and 4") were determined using a CDE ResMap resistivity probe employing 121, 81, and 49 point measurement templates, respectively. Deposition rates were determined based on the measurements of film thickness on 4" Si wafers with photo-resist patterns using a Tencor P2 profilometer. Now, the results of the experiment are described.

For the dual collimation configuration using a standard magnetron array and a physical collimator, the deposition rate was determined to be 28 Å/kW/min for Cr and 44 Å/kW/min for CoCrPt with a deposition non-uniformity of 3.2%, 1σ for both materials. The corresponding resistivities are 22.4 $\mu\Omega$-cm for a 300 Å Cr layer and 67.4 $\mu\Omega$-cm for a 370 Å CoCrPt layer. In prior work, we measured a deposition rate of 100 Å/kW/min for Cr using only the long-throw collimator. The deposition rate measured for this set of experiments is much lower and can be attributed to the additional degree of PVD collimation provided by the physical collimator.

Figure 4:
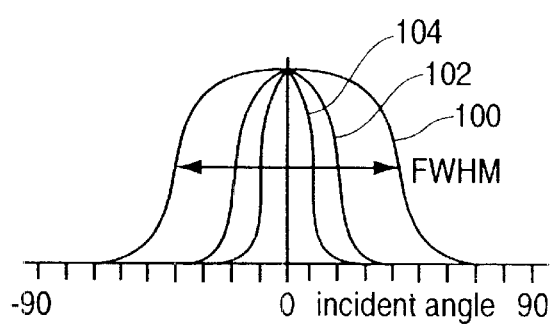
FIG. 4 is a diagram illustrating the full-width half-maximum (FWHM) distribution curves for the collimators shown in FIGS. 1a–1d.

FIG. 4 is a chart of the amount of sputtering atoms (flux) over various incident angles to the substrate. A perfectly collimated layer would have all of the atoms at a normal incidence. As shown, with no collimation, a curve 100 is produced which has a full width half maximum (FWHM) value between a +55° and a −55° incident angle. A long-throw collimator produces a curve 102 with a FWHM angular value between ±45° incident angle indicating better collimation. In accordance with the invention, a dual collimator may produce a curve 104 having a FWHM value between ±25° incident angle indicating a better collimation than no collimator or a long-throw collimator. The fact that the deposition rate was reduced only by a factor of four suggests that both the long-throw and physical collimators are providing some degree of collimation. If the long-throw collimator was not effective in filtering the flux, a larger reduction would have been measured. Another feature is that in the dual collimation configuration, the physical collimator blocks only a small fraction of the flux because most of the flux is filtered by the long throw collimator. When the physical collimator is used by itself, the physical collimator blocks a large fraction of the incident flux which necessitates frequent cleaning. Thus the dual collimation in accordance with the invention also increases the mean-wafer-between-cleans (MWBC) time since less flux reaches the physical collimator in the dual collimator. The MWBC may be further increased by improved shield designs in accordance with the invention as described below.

Figure 5:
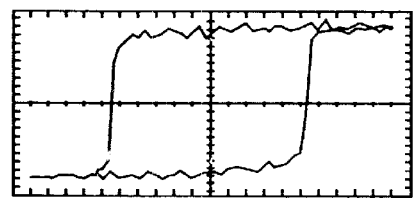
FIG. 5 is a diagram illustrating a measurement of the properties of a magnetic film deposited using the dual collimator configuration in accordance with the invention.

FIG. 5 illustrates a VSM measurement of a 0.25" square sample of the finished stack. The sample was cut from a 6" pilot wafer processed in parallel with the AlTiC pucks. The sample is isotropic and displays a coercivity of 1630 Oe, a squareness of 0.91, and a saturation magnetization of 0.9 mEMU. The film sheet resistance is 1.58 Ω/sq. with a non-uniformity value of 5.7%, 1σ.

Figures 6A, 6B:
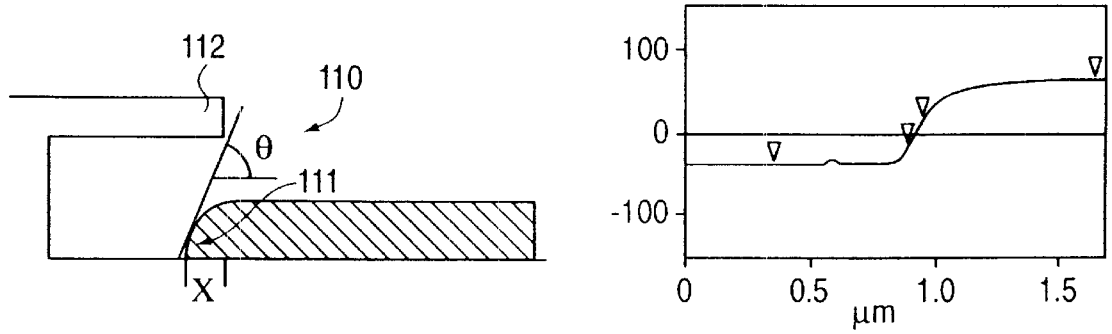
FIG. 6a is a diagram illustrating various properties of the edge of a film deposited on a lift-off structure.
FIG. 6b is a diagram illustrating an atomic force microscope scan of the edge of a film deposited on a lift-off structure fabricated with the dual collimator.

Returning to the MR head process flow as shown in FIG. 2, following deposition and removal of the resist, the sidewall angle of the metal under the overhang was characterized. FIG. 6A is a diagram illustrating properties which characterize an overhang structure 110. In particular, a sidewall angle, $\Theta$, of a sidewall 111 is ideally closer to 90°. An encroachment distance, X, is the distance that the deposited layer extends underneath an overhang 112. A smaller encroachment distance is desirable. FIG. 6B is a graph generated by an atomic force microscope (AFM) scan of the overhang structure 110 showing the sidewall angle, $\Theta$, of the sidewall 111. The sidewall angle is a function of type of collimation with dual collimation providing the steepest angle as shown in Table 2.

TABLE 2

| Collimation Method | Sidewall angle ⊖ (deg.) | Encroachment x (μm) |
|---|---|---|
| None | 10–12 | 0.55 |
| Physical | 15–17 | 0.40 |
| Long-throw | 17–20 | 0.35 |
| Dual (invention) | 31–36 | 0.15 |

FIGS. 7A and 7B are AFM scans of an MR head formed with no collimation and an MR head formed with a dual collimator in accordance with the invention, respectively. As shown, the MR head formed with non-collimated deposited atoms has a sidewall angle which is significantly less than 90° and some encroachment is evident. The MR head formed with the dual collimator has a sidewall angle closer to 90° and less encroachment. Clearly, dual collimation provides less overlap of the MR sensor. Excessive overlap will result in formation of multiple domains at the edge of the MR sensor leading to instability during operation. The reduction in overlap and material deposition under the overhang is also clear from the FIB-TEM images shown in FIGS. 8a and 8b.

Figure 9A:
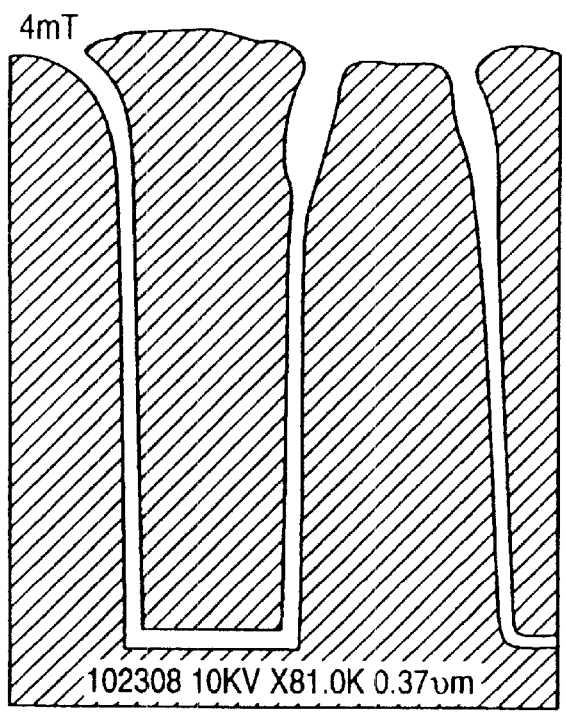
FIG. 9a is a diagram illustrating a step structure fabricated using a conventional physical collimator.
Figure 9B:
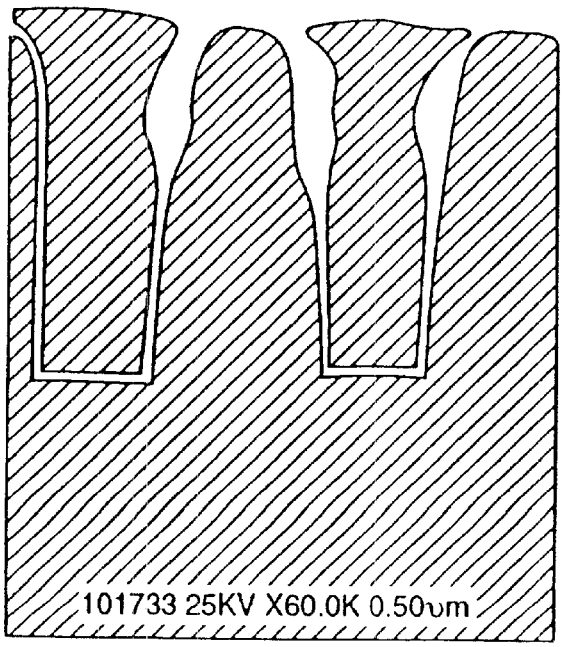
FIG. 9b is a diagram illustrating the step structure of FIG. 9a fabricated using the dual collimator in accordance with the invention.

The dual collimation may also improve step coverage. FIG. 9A is an SEM picture of via holes with a tantalum (Ta) layer deposited using physical collimation deposition and FIG. 9B is an SEM picture of via holes with a Ta layer deposited using a dual collimator in accordance with the invention. As shown, the Ta layer formed using a physical collimator has coverage on the sidewalls but poor bottom coverage whereas the Ta layer deposited using dual collimation PVD in accordance with the invention has uniform sidewalls and better bottom coverage properties.

The deposition rate and uniformity for the dual collimator in accordance with the invention may also be affected by other factors which are now described. First, the effects of different magnetron designs is discussed. The process recipes used for evaluating magnetron designs and the corresponding deposition rates are summarized in Table 3 set forth below. Different sizes of circular magnet arrays that were tested are shown in FIGS. 10a–10d including 4" (12 SmCo magnets), 6" (24 SmCo magnets), 8" (32 SmCo magnets), and 10" (40 SmCo magnets) arrays. Each array was evaluated for Cr deposition. Prior to the deposition, all samples were subjected to a pre-deposition sputter etch (clean) of the surface at 400 W for 60 seconds in a 6 mTorr Ar ambient.

For both the 6" and 8" magnetron arrays, the deposition rates were determined to be ~54 Å/kW/min in Ar at 0.8 mTorr with deposition non-uniformity values of 7.4% (1σ) and 5.2% (1σ), respectively. Thus, a smaller magnetron array may be used in conjunction with a smaller target to enhance the fraction of the target material that is deposited on the wafer which enhances the effective target utilization. However, at least 1.8 mTorr gas pressure was necessary for sustaining a stable plasma with the 4" magnetron array. For the 10" magnetron array, stable plasma could not be sustained unless the pressure was increased to 5 mTorr and the power decreased to 1 kW. In addition, the deposition rate for the 10" array was very low (i.e., approximately 4 Å/kW/min). The results are set forth in Table 3.

TABLE 3

Summary of Process Parameters for Different Magnetrons

| Parameters | Diameter | | | |
|---|---|---|---|---|
| | 4" | 6" | 8" | 10" |
| Power (W) | 2000 | 2000 | 2000 | 1000 |
| Pressure (mTorr) | 1.8 | 0.8 | 0.8 | 5 |
| Bias (W)/(V) | 9/80 | 9/80 | 9/80 | 9/80 |
| Chk. Ht. (in) | 1.3 | 1.3 | 1.3 | 1.3 |
| Flow (sccm) | 10 | 10 | 10 | 40 |
| Rate (Å/s) | | 1.8 | 1.8 | |

These preliminary experiments revealed a deposition non-uniformity of >6% (1σ) on 6" wafers for dual collimated Cr deposition using the high strength magnetron for chuck heights of 1.3" to 3.5".

To increase the collimation and deposition uniformity of the dual collimator in accordance with the invention, the physical collimator's characteristics may be modified. In particular, three different approaches were used to vary the sputtered atom flux transmission through the physical collimator in order to improve the deposition uniformity: 1) a 4" diameter piece of aluminum foil with evenly spaced holes was placed over the central area of physical collimator; 2) two pieces of round metal gauze, which were 4 cm and 1.5 cm in diameter, respectively, were stacked over the central area of physical collimator; and 3) the height of the physical collimator at predetermined points was increased. For example, the height may be increased by 4 mm in the center and the 1st hexagonal ring and by 2 mm for the 2nd hexagonal ring of the physical collimator where the original height of physical collimator was 24 mm. The first two approaches altered the collimator hole size, while the third approach locally modified the collimator height.

Figure 11:
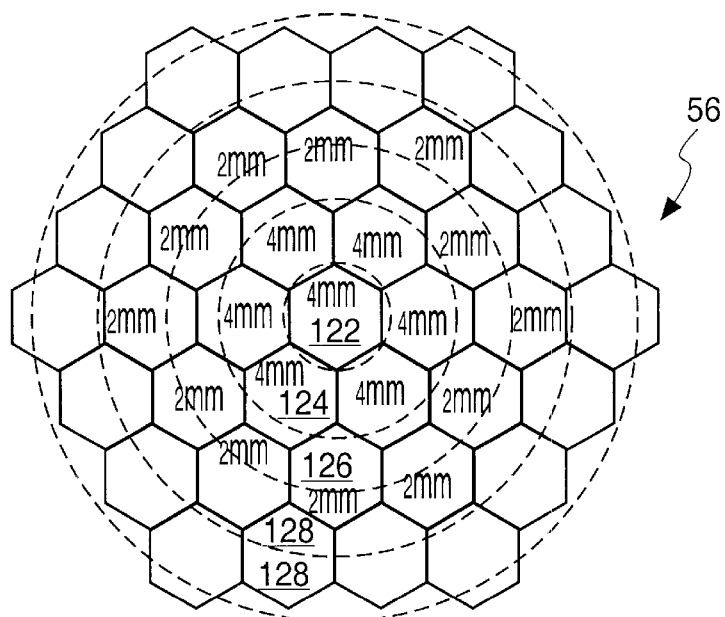
FIG. 11 is a diagram illustrating an improved physical collimator which is part of the dual collimator in accordance with the invention.

FIG. 11 is a diagram illustrating an example of a physical collimator 120 having a plurality of hexagonally shaped openings. The height of a center region 122 and a first ring of hexagonal cells 124 is 4 mm higher than the collimator which may be 24 mm high. A second ring of regions 126 may be 2 mm higher than the rest of the collimator. Thus, the central portion of the physical collimator is higher than the second ring of regions 126 which is in turn higher than a plurality of outer rings 128 of the physical collimator. Thus, the aspect ratio of the physical collimator is highest at the center of the physical collimator and decreases as one moves to the outside edge of the physical collimator. Thus, at the inner regions 122, 124 of the physical collimator, deposited atoms must be highly collimated to pass through the holes due to the higher aspect ratio. Modifying the physical collimator height locally (as with the third approach) was preferable to altering the collimator hole size (approaches 1 and 2) since only a small modulation in height is necessary, and the hexagonal geometry of the collimator is retained.

The process parameters used for the modification of physical collimator and the deposition rate are summarized in Table 4 set forth below. A high field magnetron equipped with high strength NdFeB magnets was used for this investigation. All samples received a pre-deposition sputter etch (clean) of the surface at 400 W for 60 seconds in a 6 mTorr Ar atmosphere.

TABLE 4

Process Parameters

| Parameter | Cr | Mo |
| --- | --- | --- |
| Power (W) | 4000 | 4000 |
| Pressure (mTorr) | 0.8–5 | 0.8 |
| Bias (W)/(V) | 9/80 | 9/80 |
| Chuck height (in) | 1.3–3.5 | 1.8 |
| Flow (sccm) | 10 | 10 |
| Rate (Å/s) |  | 2.8 |

Figure 12:
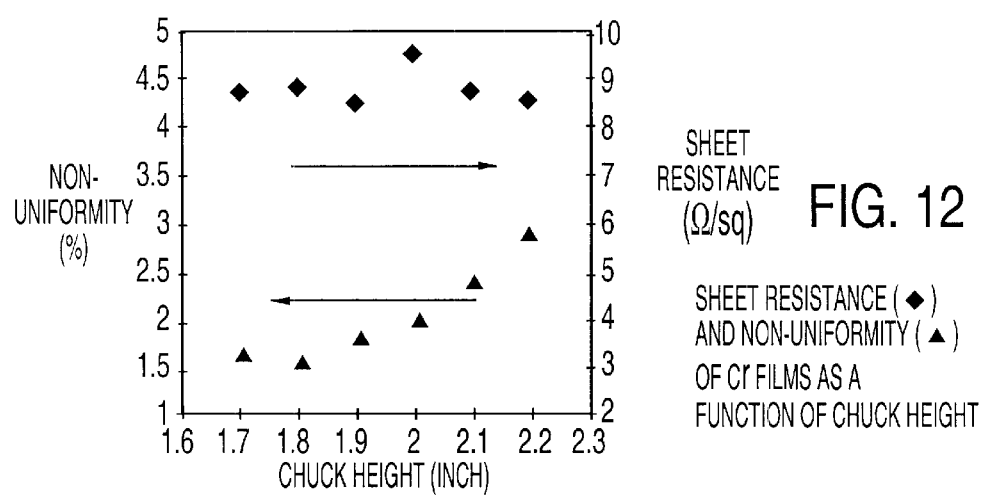
FIG. 12 is a chart illustrating the sheet resistance and non-uniformity for a Cr film as a function of chuck height.

With the modified physical collimator, a series of Cr depositions were performed at various chuck heights (1.7–2.2"). The corresponding sheet resistance and uniformity values for those depositions are summarized in Table 5 set forth below, and plotted as shown in FIG. 12. The uniformity was significantly improved, decreasing from 6.3% (1σ) to 1.6% (1σ) on 6" wafers. Corresponding non-uniformity on 5" and 4" wafers was ~1.2% (1σ) at a chuck height of 1.7–1.8". It is expected that a uniformity of <1.5% (1σ) may be achieved with further fine tuning the height of portions of the physical collimator.

TABLE 5

| Chuck Ht. (inch) | $R_s$ (Ω/sq) | Uniformity (6") (%, 1σ) | Uniformity (5") (%, 1σ) | Uniformity (4") (%, 1σ) |
| --- | --- | --- | --- | --- |
| 1.7 | 8.763 | 1.66 | 1.07 | 1.23 |
| 1.8 | 8.849 | 1.60 | 1.21 | 1.44 |
| 1.9 | 8.457 | 1.86 | 1.57 | 1.83 |
| 2.0 | 9.251 | 2.03 | — | — |
| 2.1 | 8.686 | 2.44 | — | — |
| 2.2 | 8.505 | 2.92 | — | — |

Figure 13:
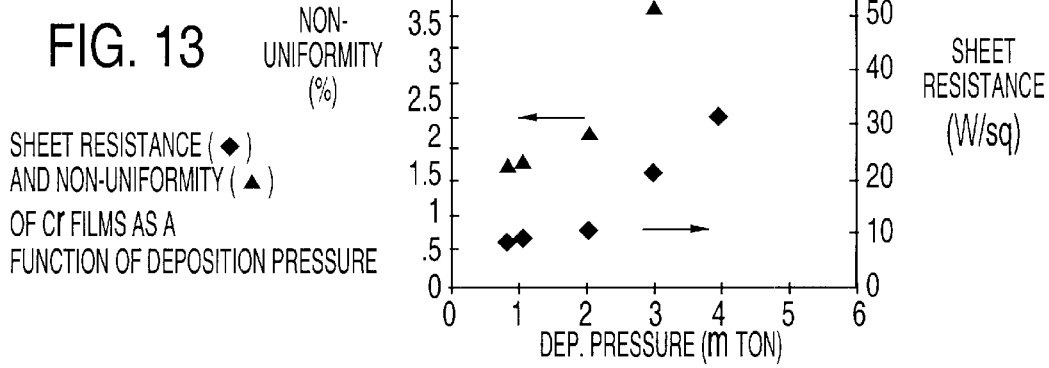
FIG. 13 is a chart illustrating the sheet resistance and non-uniformity for a Cr film as a function of deposition pressure.

A series of Cr depositions were also performed at various pressures following modification of the physical collimator. The corresponding sheet resistance and uniformity values are summarized in Table 6 as set forth below. As the deposition pressure increased, both the sheet resistance and non-uniformity increased, from 8.749 Ω/sq and 1.60% (1σ) at 0.8 mTorr to 57.13 Ω/sq and 4.98% (1σ) at 5 mTorr (at the optimized chuck height of 1.8"). These results are also shown plotted in FIG. 13.

TABLE 6

| Pressure (mTorr) | $R_s$ (Ω/sq) | Uniformity (6") (%, 1σ) | Uniformity (5") (%, 1σ) | Uniformity (4") (%, 1σ) |
| --- | --- | --- | --- | --- |
| 0.8 | 8.763 | 1.60 | 1.07 | 1.23 |
| 1.0 | 9.430 | 1.69 | 1.26 | 1.66 |
| 2.0 | 13.05 | 2.02 | — | — |
| 3.0 | 21.42 | 3.68 | — | — |
| 4.0 | 32.37 | 4.54 | — | — |
| 5.0 | 57.13 | 4.98 | — | — |

Further investigation of dual collimated Mo deposition was also conducted in order to determine whether the modified physical collimator was also suitable for a heavier metal target. The results showed a deposition non-uniformity of 2.3% (1σ) on 6" wafers although the atomic weight of Mo is about twice that of Cr (96 g/mole for Mo compared to 52 g/mole for Cr). This results in higher average kinetic energy and reduced scattering due to the collisions with background gas atoms.

Figure 14:
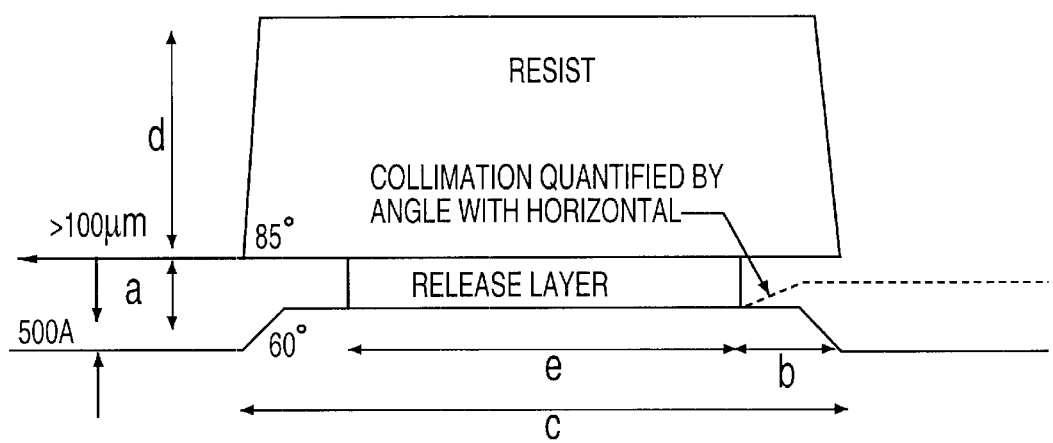
FIG. 14 is a diagram illustrating a simulated lift-off structure.

To further understand the invention, several simulations were performed. These simulations were performed using a software application known as SIMBAD (a profile evolution program from the Univ. of Alberta Microelectronics Center) to determine the effect of collimation on the FWHM of the sputtered flux incident on the wafer. A schematic of a resist structure (for lift-off patterning) that was used for the simulation is shown in FIG. 14 and various typical dimensions are shown in Table 7a.

TABLE 7A

Pattern Geometry

| Dimension | Value |
| --- | --- |
| a (μm) | 0.04–0.12 |
| b (μm) | 0.1–0.3 |
| c (μm) | 1.2 |
| d (μm) | 0.3–0.7 |
| e (μm) | 1 |
| Metal (Å) | 400–2200 |

It is desirable is to prevent deposition under the overhang so that the resist lifts off cleanly following sputter deposition. The purpose of the simulation was to adjust the collimation of the incoming sputter species to match the experimentally observed sidewall angle. The incoming distribution of sputtered atoms was parameterized as $\cos^x \alpha$ where α is angle of the sputtered flux incident at the wafer. The parameter x was varied until the sidewall angle that the edge of the metal makes with the horizontal plane matched the experimental results described above. As discussed before, the collimation can be quantified by the sidewall angle; the greater the collimation, the greater the angle that the edge of the metal makes with the horizontal (see FIG. 14). The sidewall angle for various types of collimation (derived from the experimental data above) is shown in Table 7b. A sticking coefficient of 0.9 was assumed for the simulations.

TABLE 7B

Effects of Collimation

| Angle of metal | Value |
| --- | --- |
| No collimation | 10° |
| Long-throw collimation | 16° |
| Dual collimation | 32° |

Figure 15A:
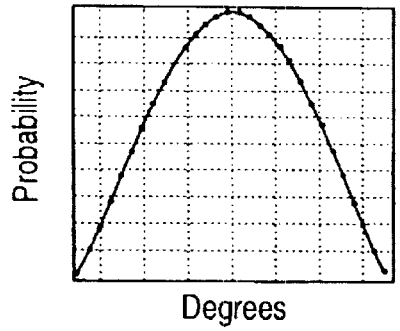
FIGS. 15A–15B are charts illustrating the FWHM value sputter distribution and simulated deposition, respectively, when no collimation is used.
Figure 15B:
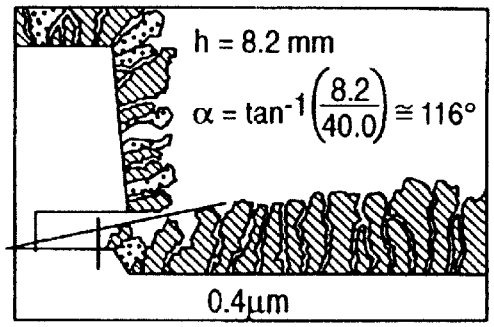
Figure 16A:
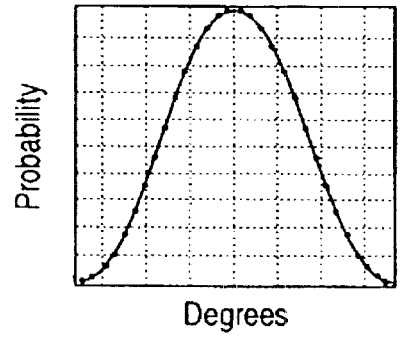
FIGS. 16A–16B are charts illustrating the FWHM value sputter distribution and simulated deposition, respectively, when long-throw collimation is used.
Figure 16B:
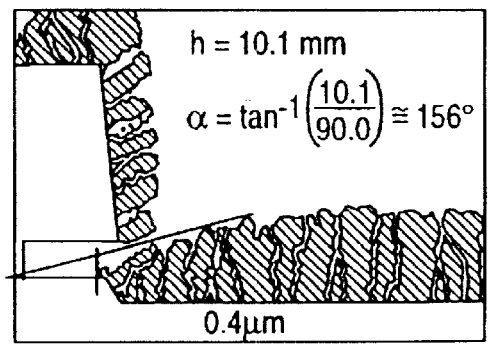
Figure 17A:
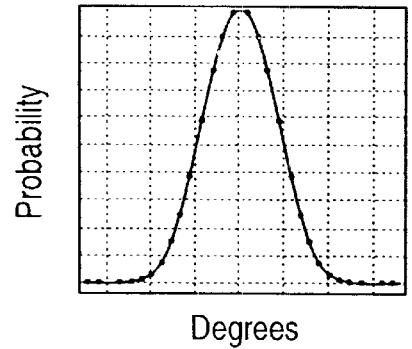
FIGS. 17A–17B are charts illustrating the FWHM value sputter distribution and simulated deposition, respectively, for dual collimation in accordance with the invention.
Figure 17B:
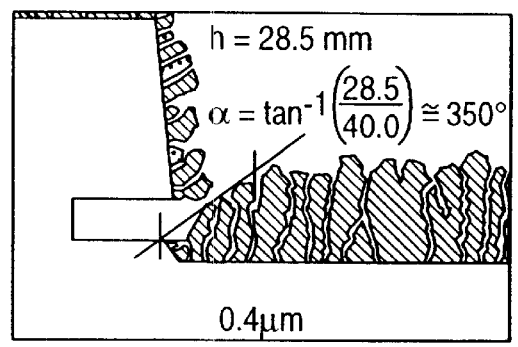

The results of the simulation are shown in FIGS. 15a and 15b for no collimation, FIGS. 16a and 16b for long-throw collimation and FIGS. 17a and 17b for dual collimation in accordance with the invention, respectively. Comparing FIGS. 15a, 16a and 17a, the flux distribution for a dual collimator is more collimated as shown by the narrower peak region. As shown in FIGS. 15b, 16b and 17b, no collimation permit quite a bit of material to be deposited underneath the overhang while the dual collimation does not have much material deposited under the overhang. As can be seen, the abutted junction is best defined for the dual collimation since the FWHM of the sputtered atom distribution incident on the wafer surface is ±25° compared to ±45° for long-throw collimation and ±55° for no collimation.

For the best performance for an abutted junction, a permanent magnet must contact the MR sensor only along the beveled surface with minimal overlap. Any overlap with the MR sensor is not desirable since it affects the track width and does not provide well defined magnetic orientation/biasing. Dual collimation clearly provides a well defined abutted junction with these attributes.

In addition to the above abutted junction simulation, the effect of collimation parameters on the incoming flux of atoms at the wafer surface was simulated in order to determine the optimal collimator dimensions. The following geometry, as shown in FIG. 18, was simulated. In this simulation, a target 130 was 12" in diameter, a wafer 132 was 6" in diameter, a region 134 of the chamber above a physical collimator 136 was 12" high and 19" diameter, a lower region 138 was 3" high and the physical collimator 136 was 1" tall with a 2:1 aspect ratio.

The nominal operating conditions were a pressure of 1 mTorr, Ar sputtering gas, and a Cr target. Uniform, full-face erosion of the target was assumed, which is valid for a rotating magnetron design. The physical collimator consists of 0.5" diameter hexagonal holes that are 1" tall. The transmission rate through the collimator was set at 80% (i.e., if all the atoms were traveling normal to the target surface, 80% of the atoms would pass through the collimator). The intent of the simulation was to determine the angular distribution of the flux of atoms arriving at the wafer surface as a function of chamber height (h). The nominal chamber height is 12", but chamber heights of 6", 9", 12" and 15" were evaluated. The angular distribution was computed both at the center of the wafer and at the edge of the wafer for comparison. The FWHM of the angular distribution was used as a quantitative measure of the degree of collimation.

The following physical phenomena were included in the simulation: 1) 2-D axisymmetric geometry; 2) cos Θ dependence of flux ejected from the target; 3) Uniform and full face erosion of the target; 4) Scattering of atoms through collisions with the background gas; and 5) Physical blocking of atoms with large angle trajectories by the collimator. Additional parameter values used in the simulation are set forth on Table 8.

TABLE 8

Process Parameters

| Parameter | Value | Parameter | Value |
|---|---|---|---|
| Target voltage | 400 V | Wafer diameter | 6" |
| Cr binding energy | 4.1 eV | Gas temperature | 125° C. |
| Cr mass | 52 amu | Ar mass | 37.55 amu |
| Chamber radius | 9.5" | Pressure | 1 mTorr |
| Throw distance | 10–19" | Collimator | 0.5" × 1" |

Figure 20:
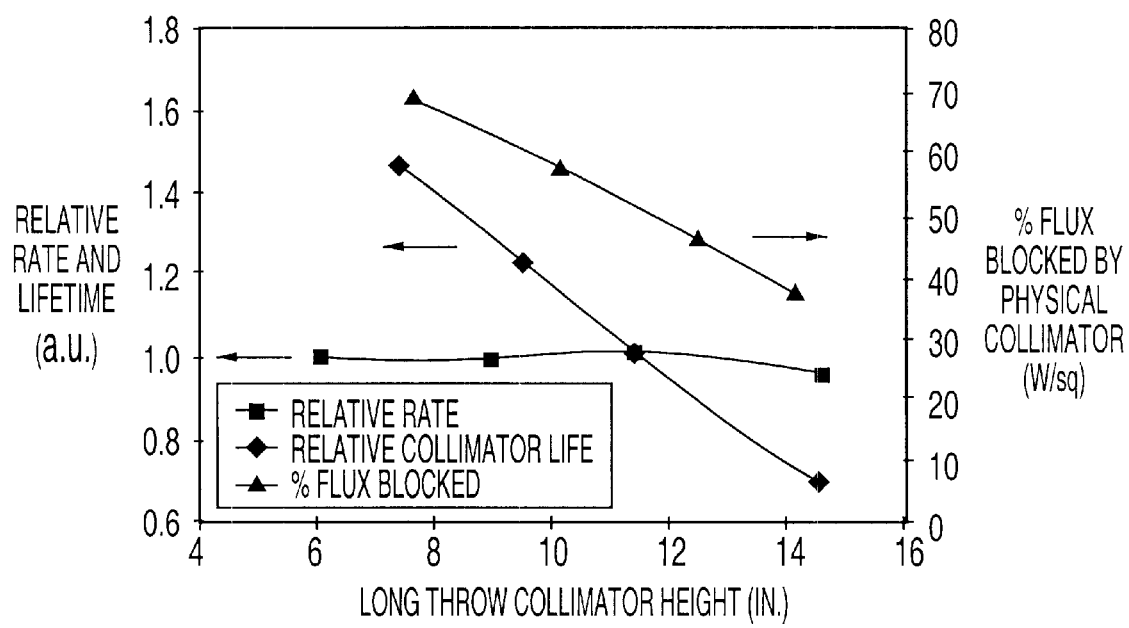
FIG. 20 is a chart illustrating various performance parameters of a dual collimator in accordance with the invention.

The full width half maximum (FWHM) of the angular distribution of the atomic flux arriving at the wafer surface as it depends of the height of the long-throw collimator arc shown in FIG. 19a and the angular distribution for a 12" tall collimator is shown in FIG. 19b. The FWHM is only slightly dependent on the height of the long-throw collimator. However, the relative deposition rate and relative lifetime of the physical collimator is very dependent on the height of the long-throw collimator as shown in FIG. 20. The relative lifetime is related to the ratios of the deposition rate on the physical collimator and the wafer. The lower the ratio, the longer the lifetime of the physical collimator. These simulations indicate that a long-throw collimator height of 6"–9" is optimal for this application.

The basic configuration of the dual collimation apparatus in accordance with the invention has now been described. There are a number of enhancements which may improve the collimation or the deposition uniformity of the dual collimator. For example, more than one physical collimator may be used to create a configuration in which a physical collimator is located at both ends of the long-throw collimator. In addition to further improve collimation, such a dual physical collimator configuration can provide additional advantages such as separating the process space around the target from the process space around the wafer. If the long-throw collimator is equipped with a pumping port and a gas injection ring is installed around the target, an inert gas can be injected through the gas injection ring around the target, while a reactive gas may be injected in the vicinity of the wafer. This would permit a chemical reaction to proceed at the wafer surface without poisoning the target. In addition, an electron source (e.g., a hollow-cathode source) may be installed in the long-throw collimator to allow for low pressure processing near the wafer which is desirable to reduce the probability of scattering collisions within the long-throw collimator. Also, the optimal collimator aspect ratio depends on the application, and a lower collimation can be traded off for improved productivity.

While the dual collimation system has been demonstrated for DC magnetron sputtering, it may also be used in conjunction with other sputtering techniques such as RF diode sputtering, ionized physical-vapor deposition (PVD) and ion beam deposition. For ionized PVD, the physical collimator may also be biased to preferentially extract directional ionized atoms.

One limitation of a sputter deposition apparatus is the flaking of deposited material from the walls of the long-throw collimator. This is especially acute in the lower portion of the long-throw collimator where the incoming flux is incident at glancing angles to the surface of the walls of the long-throw collimator. Any flux at large incident angles usually results in films with high tensile stress that are prone to delamination/flaking. The delamination/flaking of the film on the shield may corrupt the film deposited on the wafer. Several potential solutions to this problem include: 1) the use of 'chevron' shaped or conical shields that reduce incidence angles of the incoming flux as described below; 2) aperture shields to block the large angle flux from reaching the walls of the physical collimator, and 3) lining the inner surface of the long throw collimator with shields that have special coatings (e.g., flame sprayed A1) that promote adhesion.

Figure 21:
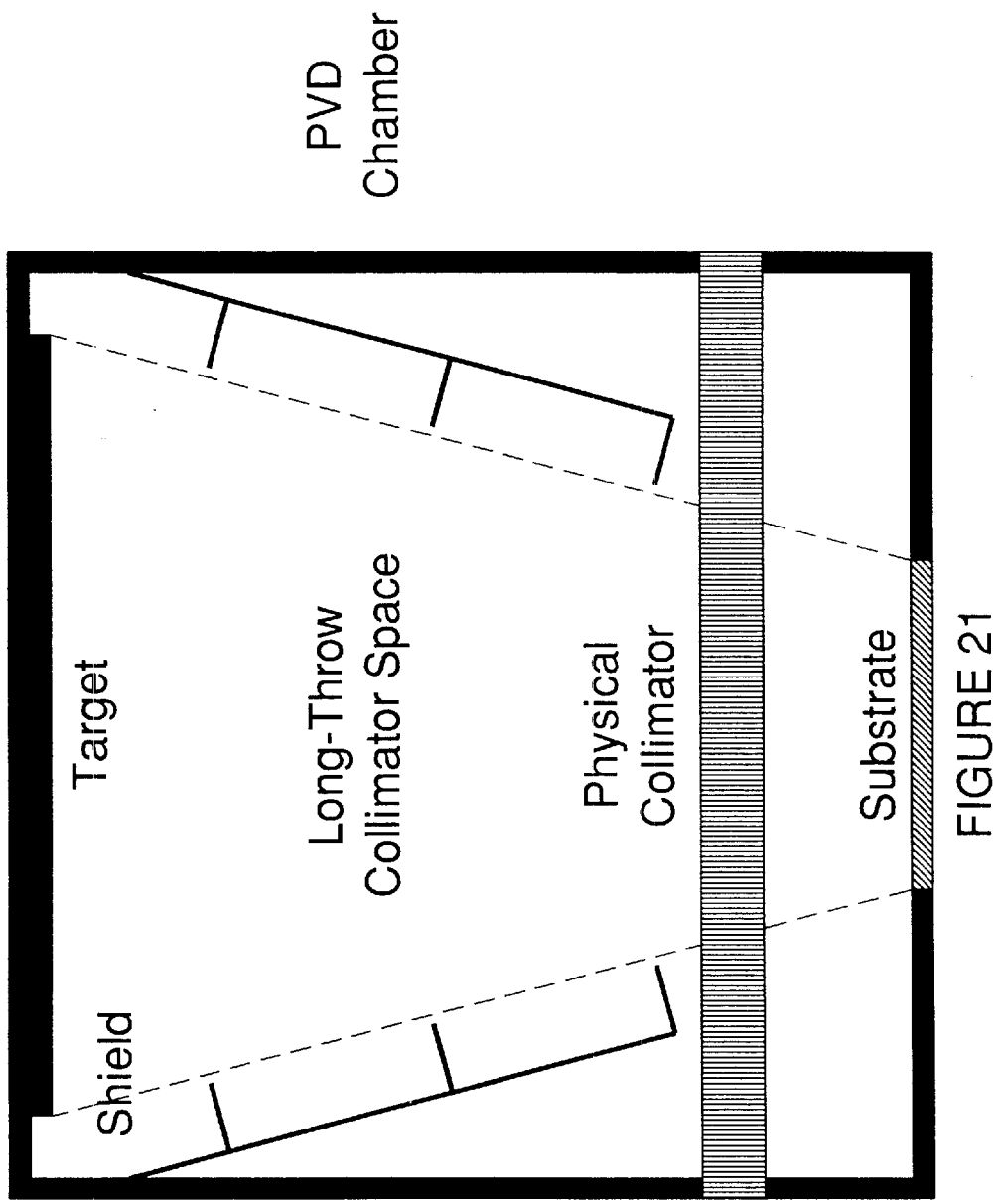
FIG. 21 is a diagram of a first embodiment of a shield.
Figure 22:
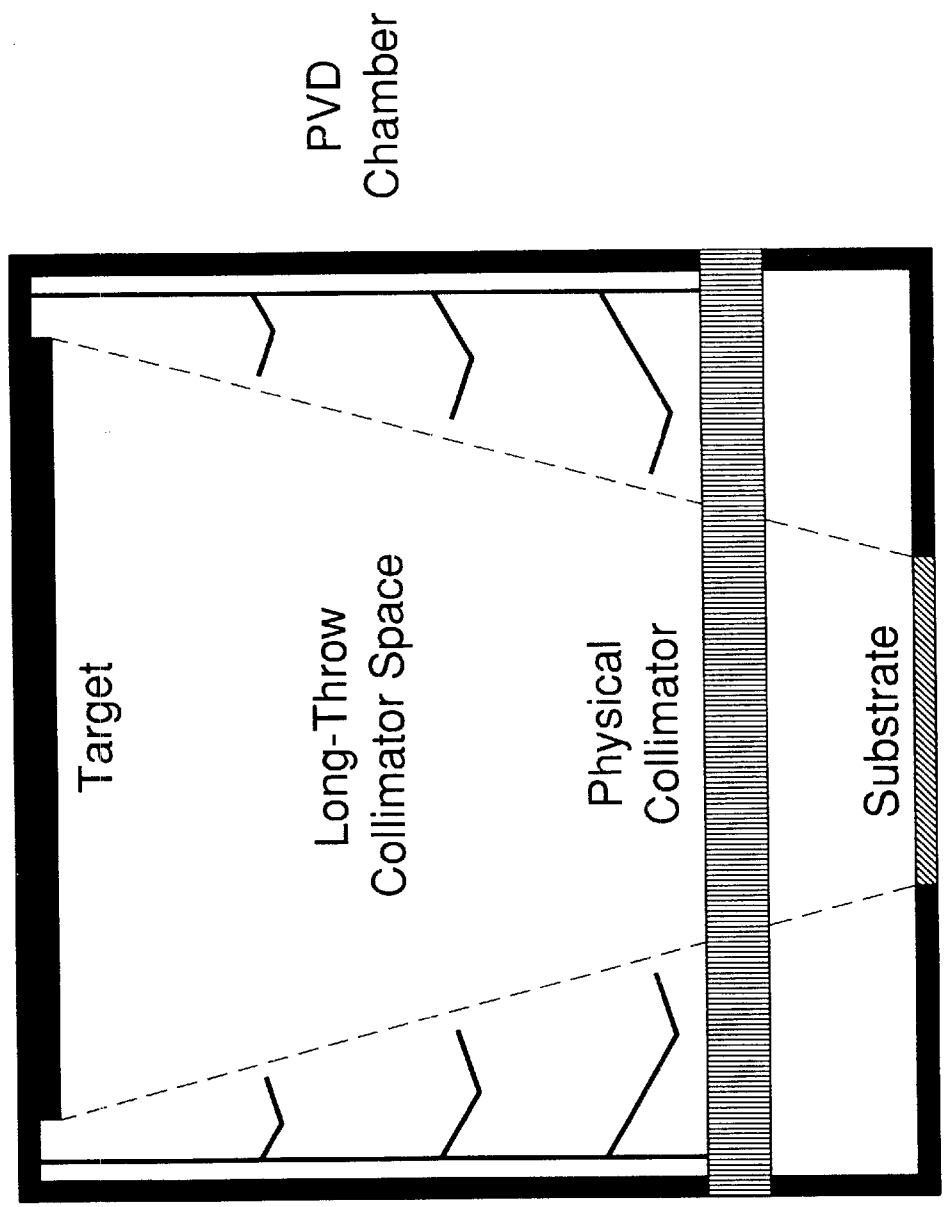
FIG. 22 is a diagram of a second embodiment of a shield.

FIGS. 21 and 22 are diagrams illustrating several embodiments of a shield 140 that decrease incident angles of incoming flux. In particular, as shown in FIG. 21, the shield 140 may include inwardly slanted sidewalls 142, 144 and a plurality of rings 146, substantially perpendicular to the sidewalls. As atoms are released from a target 148, they may strike the shield 140 at closer to a 90° incident angle due to the slanted shield design so that the film produced on the shield is less likely to delaminate or flake. In addition, at a shelf 150 formed by the rings 146 and the slanted sidewalls 142, 144, any material which delaminates or flakes off may be caught by the shelf instead of clogging up the holes in a physical collimator 152. Therefore, the mean-time-between-cleans of the physical collimator is increased resulting in improved PVD productivity.

FIG. 22 is another embodiment of the shield 140 that may have a cylindrical main shield 160, a plurality of circular arms 164 which intersect the cylindrical shield at a predetermined angle, and an outer bent portion 166 located at the end of the circular arms. As described above, this shield reduces the incident angle of atoms deposited on the shield to reduce delamination and may trap any delaminated material in a shelf 168 formed by the end portion and a circular arm.

The advantages of dual collimation for improved pattern definition have been demonstrated. This technique is especially suitable for patterning using both lift-off structures and shadow masks. Since collimation results in a directional flux that is similar at various points on the substrate, this technique can be used to control film texture/orientation and stress. It improves bottom coverage which is not only beneficial for liners or barriers for vias or trenches, respectively, but also for a trench/via fill. Finally, the intrinsically low deposition rate leads to other advantages such as good control at low deposition rates and reduced deposition process-induced damage of sensitive substrates.

In summary, a dual collimation method in accordance with the invention combines a long-throw collimator is combined with a physical collimator has been developed for improved step coverage for barriers/liners in vias/trenches, respectively, and reduced encroachment in lift-off structures for abutted junctions. The physical collimator provides additional filtering of the sputtered flux enhancing the collimation. Since the physical collimator blocks only a small fraction of the incoming flux, physical collimator lifetime is increased. By operating at low pressures (<2 mTorr) the probability of scattering due to collisions with background gas atoms is minimized thereby preserving collimation. The experimental data shows that bottom coverage for a 3:1 aspect ratio (A.R.) via improves from 30% (for physical collimation) to 50% for dual collimation while sidewall coverage is not significantly affected. Compared to the case of no collimation, dual collimation also results in a 3 times reduction in encroachment for lift-off structures. The sidewall angle of the metal deposited on lift-off structures with respect to the horizontal plane increases from 10° for no collimation to 16° for long-throw collimation and 32° for dual collimation. Simulations using SIMBAD indicate that the FWHM (full-width-half-maximum) of the sputtered flux incident on the wafer decreases from ±55° for no collimation to ±45° for long-throw collimation and ±25° for dual collimation. Simulations indicate that the FWHM of the sputtered flux is only weakly dependent on the height of the long-throw collimator. The lifetime of the physical collimator (when expressed in terms of the total deposition on the substrate) is invariant for collimators that are 6"–15" tall, but the deposition rate is inversely proportional to the height of the long-throw collimator.

The deposition rate decreased from 100 Å/kW/min (with long-throw collimator only) to approximately 28 Å/kW/min for a dual collimator. This decrease in rate can be attributed to the increased degree of collimation. A Cr (30 Å)/$Co_{82}Cr_6Pt_{12}$ (350 Å)/Cr (1150 Å) stack processed using dual collimation shows excellent magnetic properties with a coercivity of 1630 Oe and a squareness of 0.91. Dual collimation is an attractive approach for abutted junction formation and barrier/liner deposition in high aspect ratio vias/trenches.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. A physical-vapor deposition apparatus for depositing material from a target onto a substrate, the apparatus comprising:
    a deposition chamber;
    a target assembly housed within the chamber holding a target from which a sputter deposition flux is generated;
    a substrate holder housed within the chamber substantially facing the target assembly;
    a physical collimator between the target assembly and the substrate holder for spatially filtering of the angular distribution of sputter deposition flux impinging on the substrate; and
    a long-throw collimator disposed between the physical collimator and the target assembly and defining a predetermined long-throw distance therebetween to provide, in combination with the physical collimator, a collimated deposition of material onto the substrate, wherein the long-throw distance results in a reduced quantity of the sputter deposition flux generated from the target assembly being deposited on the physical collimator, wherein said physical collimator comprises a perforated plate having a predetermined pattern of holes.

2. A physical-vapor deposition apparatus for depositing material from a target onto a substrate, the apparatus comprising:
    a deposition chamber;
    a target assembly housed within the chamber holding a target from which a sputter deposition flux is generated;
    a substrate holder housed within the chamber substantially facing the target assembly;
    a physical collimator between the target assembly and the substrate holder for spatially filtering of the angular distribution of sputter deposition flux impinging on the substrate; and
    a long-throw collimator disposed between the physical collimator and the target assembly and defining a predetermined long-throw distance therebetween to provide, in combination with the physical collimator, a collimated deposition of material onto the substrate, wherein the long-throw distance results in a reduced quantity of the sputter deposition flux generated from the target assembly being deposited on the physical collimator, wherein said physical collimator comprises a perforated plate having a predetermined pattern of circular holes.

3. A physical-vapor deposition apparatus for depositing material from a target onto a substrate, the apparatus comprising:
    a deposition chamber;
    a target assembly housed within the chamber holding a target from which a sputter deposition flux is generated;
    a substrate holder housed within the chamber substantially facing the target assembly;
    a physical collimator between the target assembly and the substrate holder for spatially filtering of the angular distribution of sputter deposition flux impinging on the substrate; and
    a long-throw collimator disposed between the physical collimator and the target assembly and defining a predetermined long-throw distance therebetween to provide, in combination with the physical collimator, a collimated deposition of material onto the substrate, wherein the long-throw distance results in a reduced quantity of the sputter deposition flux generated from the target assembly being deposited on the physical collimator, wherein said physical collimator comprises a perforated plate having a predetermined pattern of hexagonal holes.

* * * * *